(12) United States Patent
Kobayashi et al.

(10) Patent No.: US 8,277,884 B2
(45) Date of Patent: Oct. 2, 2012

(54) COATING AND PROCESSING APPARATUS AND METHOD

(75) Inventors: Shinji Kobayashi, Kikuchi-gun (JP);
Tetsushi Miyamoto, Kikuchi-gun (JP);
Masahito Hamada, Kikuchi-gun (JP);
Masatoshi Kaneda, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 56 days.

(21) Appl. No.: 12/569,988

(22) Filed: Sep. 30, 2009

(65) Prior Publication Data
US 2010/0034969 A1 Feb. 11, 2010

Related U.S. Application Data

(62) Division of application No. 10/795,269, filed on Mar. 9, 2004, now Pat. No. 7,615,117.

(30) Foreign Application Priority Data

Mar. 10, 2003 (JP) ................................. 2003-063851

(51) Int. Cl.
*B05D 3/12* (2006.01)
*B05D 1/40* (2006.01)

(52) U.S. Cl. .......... 427/240; 427/352; 427/425; 118/52; 118/320; 118/326; 438/780; 134/149; 134/153; 134/157; 134/198; 134/902

(58) Field of Classification Search ................. 427/240, 427/425, 352; 118/52, 320, 326, 612; 438/780; 134/148, 153, 198, 902, 157, 149
See application file for complete search history.

(56) References Cited

U.S. PATENT DOCUMENTS

| | | | |
|---|---|---|---|
| 5,626,913 A | 5/1997 | Tomoeda et al. |
| 5,718,763 A | 2/1998 | Tateyama et al. |
| 5,803,970 A | 9/1998 | Tateyama et al. |
| 5,815,762 A | 9/1998 | Sakai et al. |
| 5,945,161 A | 8/1999 | Hashimoto et al. |
| 6,012,858 A | 1/2000 | Konishi et al. |
| 6,063,190 A | 5/2000 | Hasebe et al. |
| 6,276,378 B1 | 8/2001 | Taniyama et al. |
| 6,496,245 B2 | 12/2002 | Kosugi et al. |

(Continued)

FOREIGN PATENT DOCUMENTS

DE 295 05 960 9/1996

(Continued)

OTHER PUBLICATIONS

JPO computer translation of JP 07-066105 A, published Mar. 1995.*

(Continued)

*Primary Examiner* — Kirsten Jolley
(74) *Attorney, Agent, or Firm* — Oblon, Spivak, McClelland, Maier & Neustadt, L.L.P.

(57) ABSTRACT

There is provided a coating and processing apparatus including a spin chuck horizontally holding a quadrangular substrate and rotating the substrate in a horizontal plane, a coating solution nozzle for supplying a coating solution to a front surface of the substrate horizontally held by the spin chuck, and a solvent supply mechanism provided in the spin chuck for supplying a solvent to a back surface of the substrate, in which the solvent supplied to the back surface of the substrate is allowed to reach the back surface and side surface of each of corners of the substrate by centrifugal force, thereby removing the coating solution attached.

12 Claims, 14 Drawing Sheets

U.S. PATENT DOCUMENTS

2002/0197853 A1* 12/2002 Nagai et al. .................. 438/639

FOREIGN PATENT DOCUMENTS

| JP | 01-236967 | 9/1989 |
|----|-----------|--------|
| JP | 04-171072 | 6/1992 |
| JP | 05-185012 | 7/1993 |
| JP | 05-200350 | 8/1993 |
| JP | 05-253528 | 10/1993 |
| JP | 07-066105 | 3/1995 |
| JP | 2000-271524 | 10/2000 |
| WO | WO 01/15818 | 3/2001 |

OTHER PUBLICATIONS

English translation of JP 4-171072 A, published Jun. 18, 1992.*

* cited by examiner

COATING AND PROCESSING APPARATUS AND METHOD

CROSS-REFERENCE TO RELATED APPLICATIONS

This application is a divisional of U.S. application Ser. No. 10/795,269, filed on Mar. 9, 2004, and is based upon and claims the benefit of priority from prior Japanese Patent Application No. 2003-063851, filed Mar. 10, 2003. The entire contents of each of the above-listed applications are incorporated herein by reference.

BACKGROUND OF THE INVENTION

1. Field of the Invention

The present invention relates to a coating and processing apparatus for applying a coating solution and removing the coating solution undesirably attached on the back and side surfaces of a mask substrate to be subjected to a light exposure step of a photolithographic process for a semiconductor device, and a method of coating and removing the coating solution.

2. Description of the Related Art

In manufacturing a semiconductor device and a liquid crystal display (LCD) device, a predetermined pattern is photolithographically formed on a photoresist film on a substrate by use of a mask substrate (reticle), that is, a so-called photolithographic process is performed. The predetermined pattern of the mask substrate is formed by forming a resist coating film on one of the surfaces of the mask substrate by spin coating and exposing the resist coating film to light to develop it.

Japanese Patent Application KOKAI No. 2000-271524 describes a coating apparatus for forming a resist coating film by applying a resist solution on a quadrangular substrate by spin coating. The coating apparatus has a spin chuck having a rectangular recess in the upper surface. When the quadrangular substrate is placed in the rectangular recess, the upper surface of the substrate is flush with that of the spin-chuck. While the quadrangular substrate placed in the recess is rotated by a spin-chuck, a resist solution is supplied to the upper surface of the substrate. After the supply of the resist solution is stopped, the substrate is still continued to rotate to cause airflow from the center of the substrate to the periphery along the surface of the substrate. Using the airflow, a solvent is vaporized from the resist solution. This is called "spin-dry". As a result, a desired resist coating film is formed.

When the dimensional accuracy of a mask pattern is low, the accuracy of wiring width is significantly affected in all semiconductor wafers exposed to light with the pattern as a mask. Therefore, it is necessary to prevent particle attachment to the mask substrate as much as possible. The probability of attaching particles to the mask substrate is the greatest when the substrate is transferred immediately after a coating process. When a transfer arm member transfers a mask substrate, it is desirable to prevent the transfer arm member from being in contact with the mask substrate as much as possible. Actually, as shown in FIG. 8A, the regions 11 with which the transfer arm member can be in contact are limited only to four corners and the middles of four sides of the substrate G. Since the transfer arm member is prohibited from being in touch with a back surface 13b and a side surface 13e of the mask substrate, the support piece 52 of the transfer arm member is allowed in contact only with a chamfered C plane 13c, as shown in FIG. 8C.

However, when a resist solution is applied to a mask substrate by use of a conventional apparatus, the resist solution enters the recess, attaches to the side surface and back surface of the mask substrate and the attached resist solution is transferred to a transfer arm member, causing cross contamination. The cross contamination frequently occurs particularly at the corner portions of the substrate.

When the resist solution is supplied to a spin-rotating substrate G, it is radially dispersed along the surface (upper surface) 13a of the substrate G and shaken off from the substrate G by centrifugal force. However, as shown in FIG. 1, when a resist solution 100 reaches the periphery of the substrate G from the center of the substrate 13a, part of the resist solution changes its direction for the corners of the substrate, entering a clearance between the side surface 13e and the inner peripheral surface of the recess of the spin chuck. Further, the resist solution may possibly reach the back surface 13b of the substrate G. The corners of the substrate G are supported by support pieces 52 of the transfer arm member, the resist solution 100 is transferred from the substrate G to the support pieces 52, and further transferred from the support pieces 52 to another substrate G, causing cross contamination. Besides this, the resist solution thus transferred is dried into particles, which may deposit on another substrate G.

BRIEF SUMMARY OF THE INVENTION

An object of the present invention is to provide a coating and processing apparatus and method for coating a coating solution and removing an unnecessary coating solution deposited on the side and back surfaces of a quadrangular substrate.

According to the present invention, there is provided a coating and processing apparatus comprising:

a spin chuck horizontally holding a quadrangular substrate and rotating the substrate in a horizontal plane;

a coating solution nozzle for supplying a coating solution to a front surface of the substrate horizontally held by the spin chuck; and a rinse liquid supply unit provided in the spin chuck for supplying a rinse liquid to a back surface of the substrate, in which the rinse liquid supplied to the back surface of the substrate is allowed to reach the back surface and side surface of each of the corner portions of the substrate by centrifugal force produced by rotation of the spin chuck, thereby removing the coating solution attached.

According to the present invention, since a quadrangular substrate, spin chuck and rinse liquid supply unit are synchronously rotated, the centrifugal force on and surface tension of the rinse liquid work in concert, with the result that the resist deposit can be efficiently removed from the back and side surfaces of the corner portions of a substrate. Therefore, when the corner portions of the substrate are held by a transfer arm member, the resist solution cannot be transferred to the transfer arm member. In this manner, cross contamination via the transfer arm member can be effectively prevented.

The rinse liquid supply unit has a rinse liquid supply port at the portion corresponding to each of the corner portions of the substrate.

The spin chuck has a holding plate facing the back surface of the substrate and substrate-supporting members for supporting the peripheral edge of the substrate with a clearance between the substrate and the substrate holding plate.

Furthermore, the rinse liquid supply unit has a plurality of nozzles for spraying a rinse liquid onto the lower surface of a rotating holding plate and guide channels for guiding the rinse liquid to the clearance between the back surface of the substrate and the holding plate with the help of centrifugal force.

The guide channels are through-holes radially arranged on a concentric circle around a rotation center of the holding plate.

Furthermore, the guide channels are through-holes obliquely passing outward from the lower surface to the upper surface of the holding plate for smoothly supplying the rinse liquid applied to the lower surface of the holding plate by the nozzle, toward the back surface of the substrate.

Each of the guide channels serving as a rinse liquid supply port is formed at a position of the holding plate corresponding to each of the corner portions of the substrate.

The guide channels are formed near the corresponding corner portions of the substrate so as to bridge the diagonal lines of the substrate.

A cover having a rinse liquid collecting unit is provided on the back surface side of the holding plate; and the rinse liquid in the rinse liquid collecting unit is supplied onto the back surface through the guide channel.

A wall is further provided along the periphery of the holding plate except around the corner portions of the substrate so as to face the side surfaces of the substrate.

Cut-away portions are formed such that the corner portions of the substrate held by the spin chuck are exposed; and the substrate is transferred while being held by the transfer arm member at the back surfaces of the exposed corner portions.

Spacers are provided on the inner surfaces so as to face each other with the diagonal line interposed between them for aligning the substrate held by the spin chuck and directing the rinse liquid toward the extension of the diagonal line of the substrate.

According to the present invention, there is provided a method of coating a coating solution on a quadrangular substrate and removing a coating solution undesirably attached onto a back surface and side surface of the quadrangular substrate, comprising the steps of:

(a) holding the quadrangular substrate horizontally by a spin chuck;

(b) supplying a coating solution from a coating solution nozzle to a surface of the substrate held by the spin chuck and spreading the coating solution with the help of centrifugal force by rotating the spin chuck around a vertical axis; and (c) supplying a rinse liquid to a back surface of the substrate from a rinse liquid supply unit while rotating the spin chuck and the rinse liquid supply unit synchronously around the vertical axis, thereby permitting the rinse liquid to reach the corner portions of the substrate with the help of centrifugal force to wash away the coating solution.

In step a, the periphery of the substrate is held by the substrate supporting member provided on the holding plate with a clearance between the substrate and the holding plate; and in step c, the rinse liquid is supplied to the clearance.

In step c, the rinse liquid is supplied through a guide channel serving as a rinse liquid supply port formed at a position of the holding plate corresponding to each of the corner portions of the substrate.

The guide channels are through-holes radially arranged on a concentric circle around a rotation center of the holding plate. Further, the guide channels are through-holes obliquely passing outward from the lower surface to the upper surface of the holding plate for smoothly directing the rinse liquid sprayed on the lower surface of the holding plate by the nozzle toward the back surface of the substrate.

In step c, the substrate is rotated by the spin chuck alternately at a predetermined low rotation speed and high rotation speed within a range of 200 to 1,500 rpm.

In step c, an acceleration rate for changing the low rotation speed to the high rotation speed and a deceleration rate for changing the high rotation speed to the low rotation speed fall within the range of 1,000 to 5,000 rpm/second.

DETAILED DESCRIPTION OF THE INVENTION

Preferable embodiments of the present invention will be explained with reference to the accompanying drawings.

Figure 2:
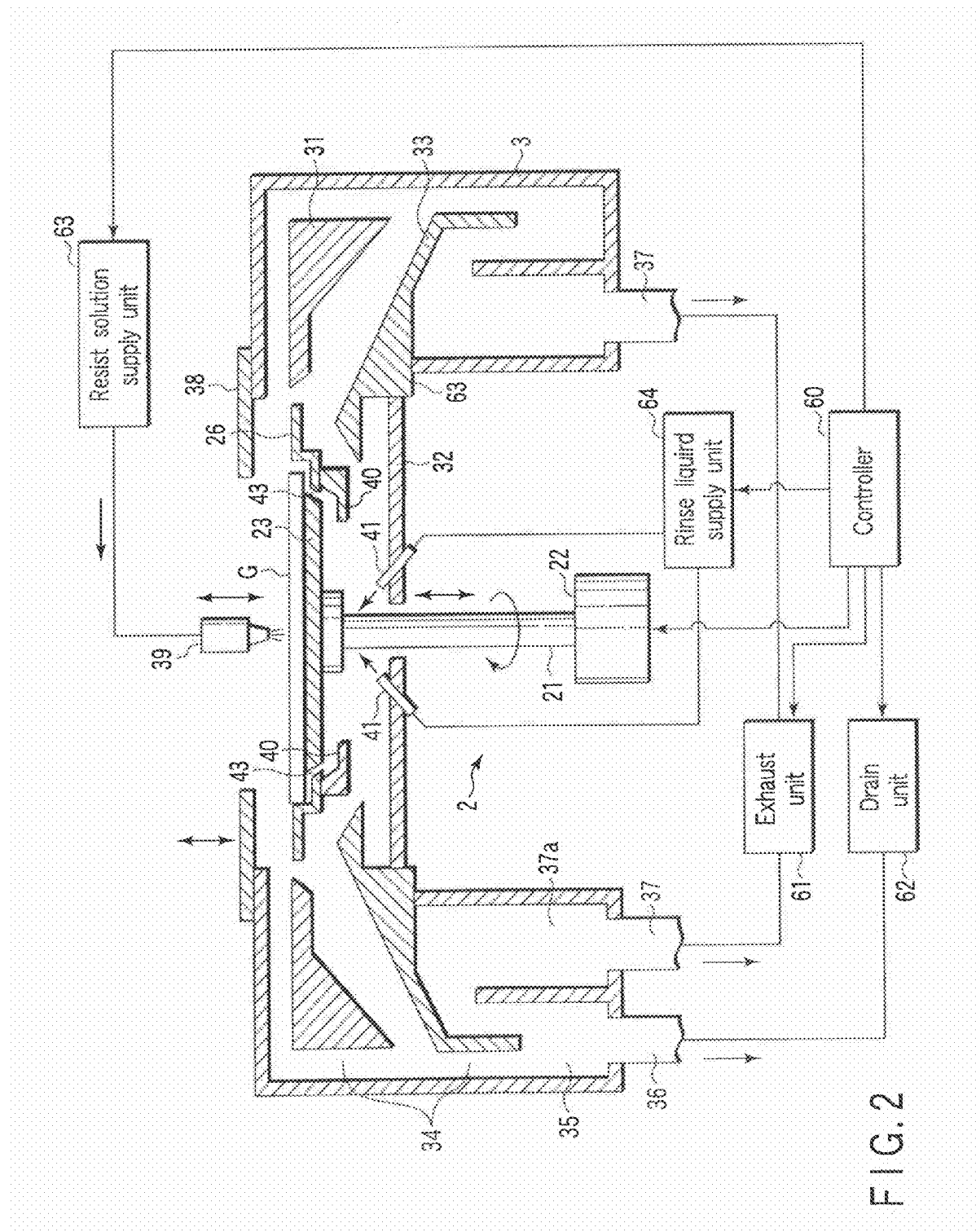
FIG. 2 is a schematic sectional view showing a coating and processing apparatus according to an embodiment of the present invention, along with a block diagram showing peripheral elements.

As shown in FIG. 2, a spin chuck 2 is accommodated within a cup 3 of the coating and processing apparatus. The spin chuck 2 receives a mask substrate G (work piece) from a transfer arm mechanism 5 shown in FIG. 7 and performs predetermined coating treatment to the substrate G. The mask substrate G (work piece) is formed of square quartz glass having a side length L1 of 152±0.4 mm, on which a chromium oxide ($Cr_2O_3$) coating film is applied, and further on the chromium oxide, a resist coating film formed. The thickness of the mask substrate G is a quarter inch (6.35±0.1 mm) and the projected length of the C plane is 0.2 to 0.6 mm.

The spin chuck 2 has a holding plate 23 for holding a quadrangular substrate G. The holding plate 23 is connected to a driving unit 22 via a rotation axis 21. The driving unit 22, which is controlled by a controller 60, rotates the spin chuck 2 around the Z-axis and moves the spin chuck up and down along the Z-axis.

Next, the rinse liquid supply unit will be explained.

The rinse liquid supply unit is provided below the spin chuck 2 for cleaning the back and side surfaces of the substrate G. The rinse liquid supply unit includes a rinse liquid supply source 64, a plurality of nozzles, a cover, a guide channel provided on a holding plate 23. A plurality of nozzles 41 communicates with the rinse liquid supply source 64 and supported by a circular plate 32 such that each of the nozzles faces the lower surface of the holding plate 23. The nozzles 41 are attached to the circular plate 32. These nozzles are divided into two groups, which are arranged axisymmetric with respect to a shaft 21 and obliquely arranged so as to face each other.

Figure 1:
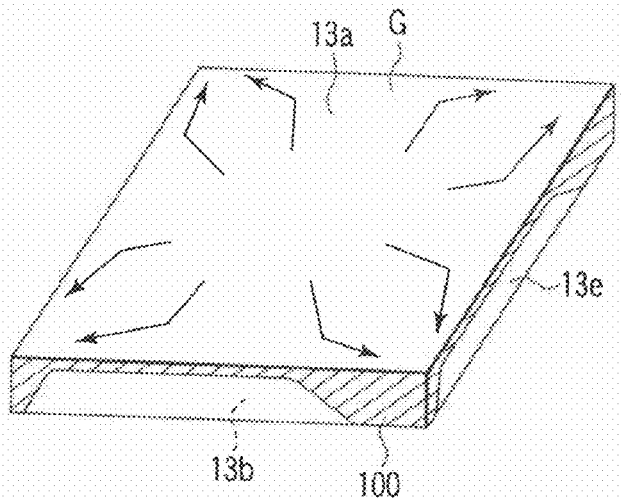
FIG. 1 is a schematic perspective view showing the surface state of a substrate when a resist is coated by a conventional apparatus.
Figure 3:
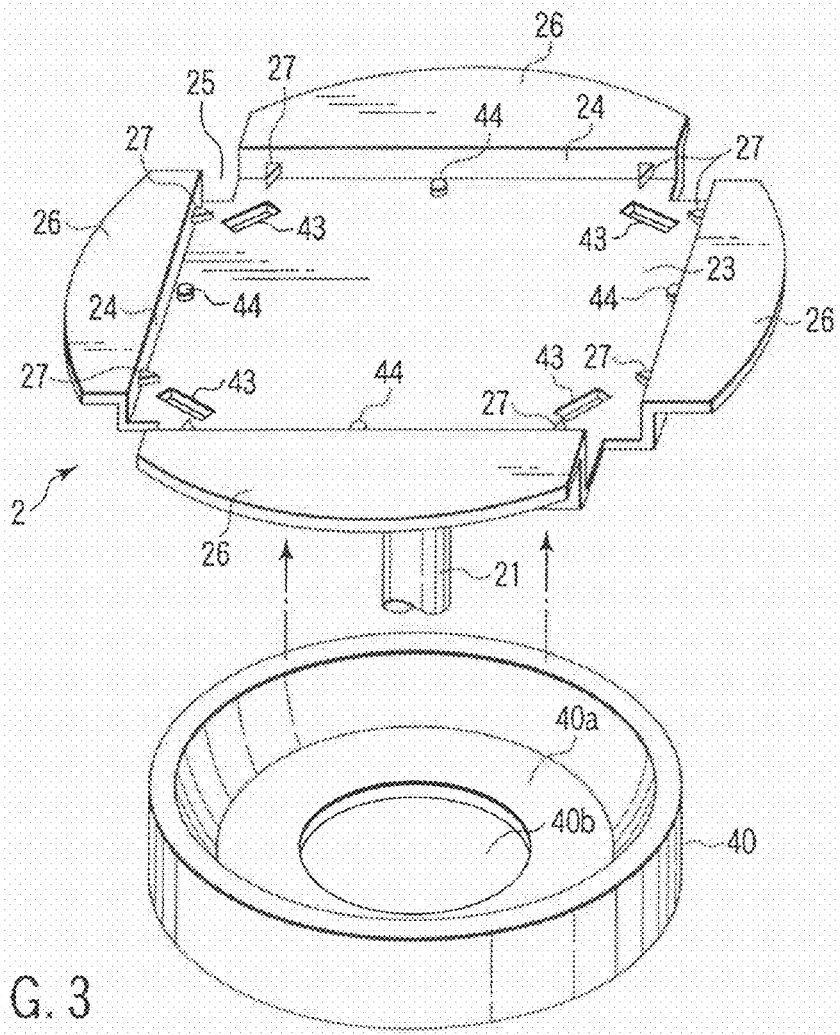
FIG. 3 is perspective view, partly broken away, showing a spin chuck according to an embodiment.

The cover 40 has a clean bowl form with a large hole at the bottom, as shown in FIG. 3, and attached to the lower portion of the holding plate 23 so as to cover entire lower surface of the holding plate 23. The upper portion of the cover 40 is completely opened and the lower portion thereof has a central hole 40b. A rinse liquid collecting portion 40a, which is formed at the lower portion extending from the peripheral to the inside, defines a central opening 40b. The rinse liquid discharged from the nozzles 41 passes through the central opening 40b of the cover 40, strikes the lower surface of the holding plate 23, heads for the guide channel 43 along the lower surface of the holding plate 23 by centrifugal force, passes through the guide channel 43 and reaches the lower surface of the substrate G.

Furthermore, an arch-shape guide channel 43 passing through the holding plate 23 is provided near a corner of the substrate G, more specifically, 20 mm inside the corner. More specifically, the rinse liquid discharged from the nozzles 41 is supplied to a clearance between the surface of the cover 40 and the back surface of the holding plate 23, passed through the rinse liquid collecting section 40a and supplied toward the back surface of the substrate G from the guide channel 43.

The guide channels 43 are arranged so as to clean spacers 27 at the time the back surface of the substrate G is cleaned. More specifically, the guide channels 43 are provided so as to span the region surrounded by lines connecting the center of the substrate G and spacers 27. By virtue of this arrangement, the guide channel 43 acquires a function of regulating the flow of a rinse liquid toward the corner portions of the substrate G, as described later.

In this embodiment, the guide channels are arranged near the corner portions so as to span the diagonal lines of the substrate. However, the guide channels may be arranged out of the diagonal lines as long as the rinse liquid reaches to the corner portion of the substrate.

Furthermore, on the surface of the holding plate 23 a protrusion 44 is provided, for example, near the middle of each of the individual sides of the substrate G. The protrusions 44 serve as substrate supporting members for supporting the back surface of the substrate G while slightly separating upward from the surface of the holding plate 23 in order to prevent particles from attaching to the back surface of the substrate G. More specifically, the clearance is formed between the substrate G and the holding plate 23 by slightly lifting the substrate from the surface of the holding plate 23. A rinse liquid supplied from the guide channel 43 flows through the clearance to clean the corner portions of the substrate.

The protrusions 44 and the spacers 27, more specifically, portions of them in contact with the substrate G, are coated with polyether ether ketone (PEEK) to protect the substrate G from damage. The PEEK may contain carbon fibers. The other portion of the spin chuck may be appropriately formed of aluminium, an aluminum alloy, stainless steel coated with fluorine, polyether ether ketone (PEEK), or a combination of these.

As shown in FIG. 2, a first guide ring 31 is provided so as to surround the side periphery of the spin chuck 2. The first guide ring 31 has an upper surface virtually flash with that of the spin chuck 2. The lower surface of the first guide ring 31 slopes down and outward (the inner lower surface is higher than the outer lower surface). At the lower side of the spin chuck 2, the circular plate 32 is arranged so as to surround the rotation shaft of the spin chuck 2. Further, a second guide ring 33 (having an angle-form section) is formed so as to surround the outer periphery of the circular plate 32. The second guide ring 32 has the same outer radius as the first guide ring 31, and the outer peripheral edge bends and extends below.

An outer cup 3 is provided so as to surround guide rings 31 and 33. The outer cup 3 has an opening portion larger than the spin chuck 2 at the top so as to allow the spin chuck 2 to move up and down. Between the side peripheral surface and the outer peripheral surfaces of the first and second guide rings, a clearance serving as an air channel 34 is formed.

In the bottom portion of the outer cup 3, there is a curved and bend channel formed with the help of the outer-periphery of the second guide ring 33. The curved and bend portion serves as an air/liquid separation portion. An excessive coating liquid passes through an outer chamber 35 and is discharged from a drainage port 36, whereas a gas passes through an inner chamber 37a and is expelled from an exhaust port 37 by the suction force of a pump (not shown). Note that the exhaust amount of the cup according to the present invention is, for example, 900 inch aqua (corresponding to 260 to 270 Pa), which corresponds to about 5 to 6 times that of a general silicon wafer coating apparatus. Therefore, in a coating and processing apparatus of the present invention, since the cup has a larger exhaust amount than a silicon wafer coating apparatus, it is possible to prevent particles from attaching to the substrate G even if a small amount of particles are present in the cup.

Furthermore, on the upper surface, a ring plate 38 is provided which has an inner diameter, for example, 100 to 160 mm, which is smaller than the diameter of the opening portion of the outer cup 3, and an outer diameter larger than the opening portion of the outer cup 3. The ring plate 38 is supported movably up and down by a driving mechanism (not shown). Moreover, a nozzle 39 is provided so as to face the upper surface of the mask substrate G and held by the spin chuck 2. The nozzle 39 communicates with a resist supply source 63 by way of a pipe. The resist supply source 63 has a built-in mass flow controller (MFC) for controlling the supply amount of a resist solution. The operation of the MFC is controlled by a controller 60. The nozzle 39 is supported movably up and down within a X-Y plane by a plurality of moving mechanisms (not shown).

Figure 4A:
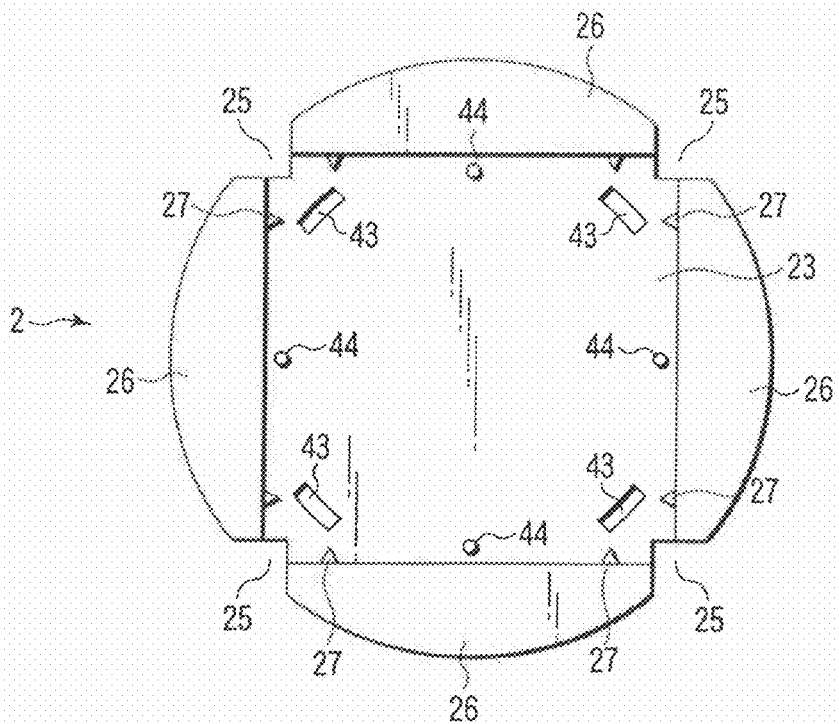
FIG. 4A is a plan view of a spin chuck as viewed from the above.
Figure 4B:
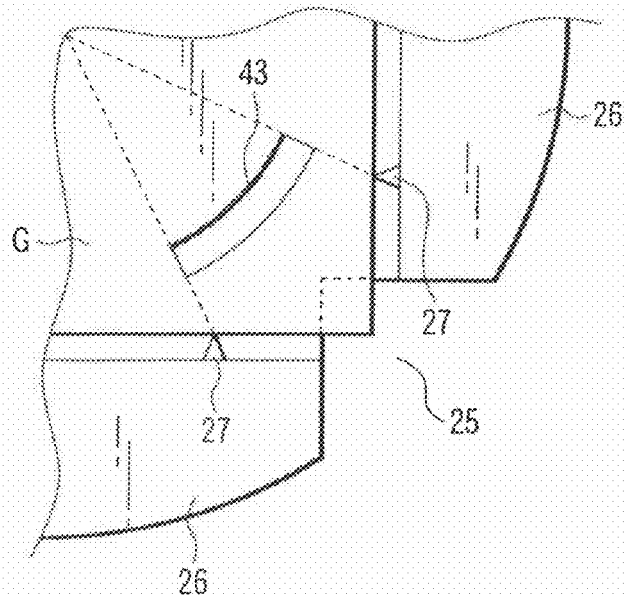
FIG. 4B is an enlarged plan view showing part of a spin check, as viewed from the above.

Referring now to FIGS. 3, 4A and 4B, the spin chuck 2 will be explained in detail.

The holding plate 23 of the spin chuck 2 for holding a substrate G is a square slightly larger than the substrate. The holding plate 23 has walls 24 which are formed along the sides of the square except the corner portions. A recess portion is formed of the holding plate 23 and the walls 24. When a substrate G is placed in the recess, the holding plate 23 faces the back surface of the substrate G. Furthermore, at the corner portions, there are cut-away portions 25 are formed by cutting away part of the holding plate 23 in a square form. Therefore, when a substrate G is placed on the holding plate 23, each of the corner portions of the substrate G (for example, about 3 to 7 mm) is exposed to the outside from the holding plate 23. A transfer arm mechanism 5 holds the exposed portions when the substrate G is loaded and unloaded.

On the upper edge of each of the walls 24, an airflow controlling member 26 (flat plate) is formed. The airflow controlling member 26 is a flat plane horizontally provided so as to be flush with the surface of the substrate G. As viewed from the top, the periphery of the airflow-controlling member 26 is formed in an arch form. More specifically, the flat-plate airflow controlling member 26 is arranged along the side of the substrate G with a gap between them so as to be nearly flush with the surface of the substrate G. The airflow controlling member 26 is, for example, formed at a position by 0.5 mm lower than the level of the substrate G and is not formed at the corner portion of the substrate G.

In the proximity of each corner portion of the spin chuck 2, a pair of spacers 27 are arranged and respectively attached to the walls 24, thereby producing a clearance, for example, about 1.5 mm, between the substrate G on the holding plate 23 and the wall 24. The spacer is formed into a shape such as a triagonal pyramid or cylinder, by which the spacer is brought into point or line contact with the side periphery of the substrate G. The spacer also has an alignment function for holding a substrate G at a desired position on the spin chuck 2. Since the substrate G is defined (fixed) by four pairs of spacers 27 form the periphery, it does not wobble on the spin chuck 2 when the substrate G is rotated.

Next, a spin chuck 2A according to another embodiment will be explained.

Figure 5:
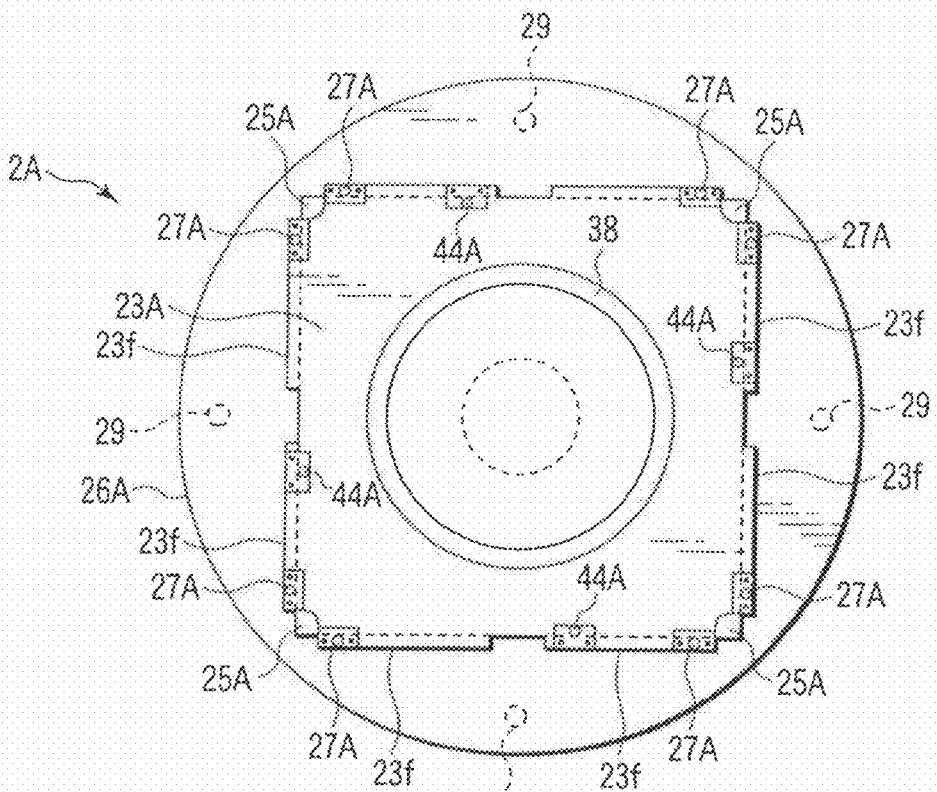
FIG. 5 is a plan view showing a spin chuck according to another embodiment, as viewed from the above.
Figure 6:
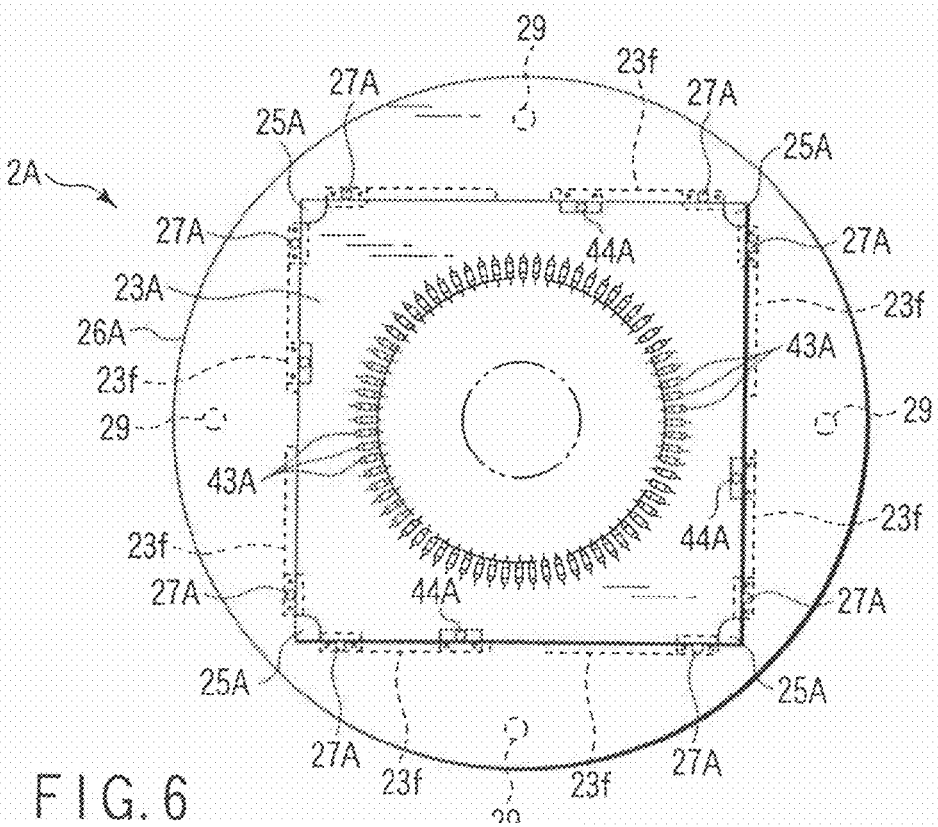
FIG. 6 is a plan view showing a spin chuck according to another embodiment, as viewed from the bottom.

FIG. 5 is a plan view of the spin chuck 2A as viewed from the upper surface side and FIG. 6 is a plan view of the spin chuck 2A as viewed from the back surface side. The spin chuck 2A has substantially a square cover 23A on the back surface. The peripheral flange 23f of the cover 23A is fixed by a screw on the periphery of the opening of an airflow controlling member 26A. Since the opening of the airflow controlling member 26A is square and the corner portions of the substantially square cover 23A are partially cut away, airflow ports 25 are formed at the portions corresponding to the corner portions of the substrate G in a plan view. The size and shape of the airflow ports 25 are determined by the sizes of the opening of the airflow controlling member 26 and cut-away portions at the four corners of the cover 23A. In this embodiment, the shape of the airflow port 25 is a fan of 5 to 10 mm radius. On the peripheral portion of the airflow controlling member 26A, a plurality of spacers 27A and protrusions are positioned to prevent the substrate G from wobbling on the spin chuck 2A.

The cover 23A has 72 liquid supply ports 43 radially and concentrically arranged. More specifically, these liquid supply ports have the same shape and size and are arranged at regular pitches. A shown in FIG. 9B, when a rinse liquid R is discharged from the nozzle 41 toward the cover 23A, the back surface of the substrate G is cleaned with the rinse liquid R as shown in FIG. 9C. Since the liquid supply ports 43 are radially arranged, the rinse liquid R is supplied in every direction to sufficiently clean the entire back surface of the substrate G.

Next, the transfer arm mechanism 5 and the mask substrate G will be explained with reference to FIGS. 7, 8A to 8D.

Figure 7:
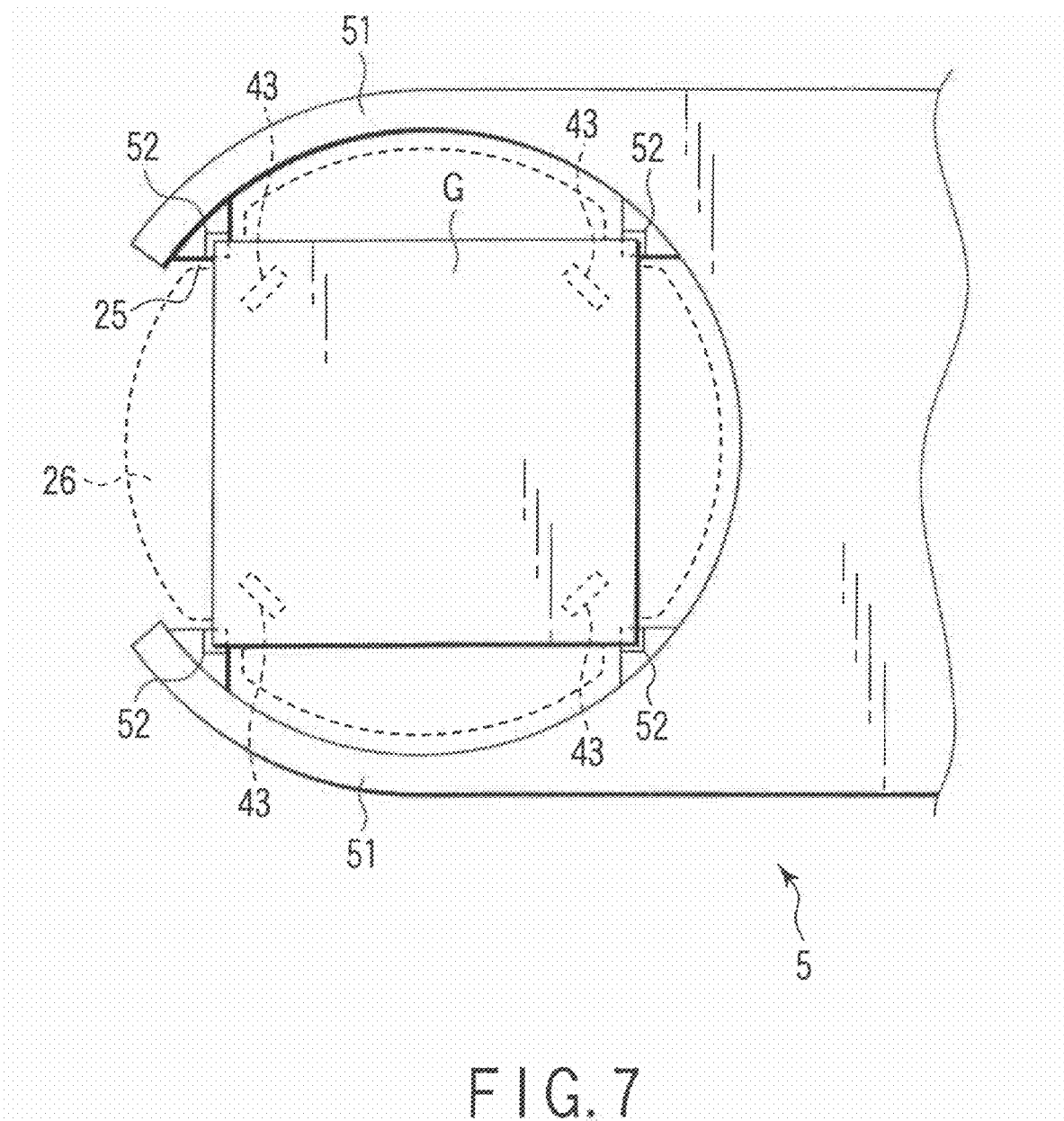
FIG. 7 is a plan view showing a spin chuck according to a gist portion of a transfer arm for transferring a quadrangular substrate to a spin chuck.

The transfer arm mechanism 5 has a horizontal arm member 51 driven by an XYZθ driving mechanism (not shown) for transferring a mask substrate G between the spin chuck and the transfer arm mechanism 5. The horizontal arm member 51 has a circular (arcuate) arm main body with an open tip, and four support pieces 52, as shown in FIG. 7. The four support pieces 52 each project inward from the inner peripheral surface of the arcuate arm body and hold the C plane 13c of the corner portion of the mask substrate G.

To prevent contamination of the mask substrate G with particles, other members must not be in contact with the back surface 13b and side surface 13e. The regions 11 with which other members may be in contact are positioned only at the corners and the middle portions of four sides. In addition, the support pieces 52 of an arm member each are in contact with the mask substrate G only at the C plane 13c, as shown in FIG. 8C and not in contact with the back surface 13b and side surface 13e of the substrate G. More specifically, the support piece 52 has a taper guide surface 52a, a tip stopper portion 52b, and a bending portion 52c. When the mask substrate G is transferred to the transfer arm mechanism 5, it slides along the taper guide surface 52a while being in contact with the support piece 52 only at the C plane 13c, and stops when the C plane 13c reaches the bent portion 52c. Since the inner diameter of an imaginary circle connecting the tip stopper portions 52b is smaller than the outer diameter of the mask substrate G, the mask substrate G may not fall off from the support pieces 52. As viewed from the top, as shown in FIG. 8D, the support piece 52 has a pair of bent portions 52c. A corner of the mask substrate G is in contact with the pair of bent portions 52c.

Figure 8A:
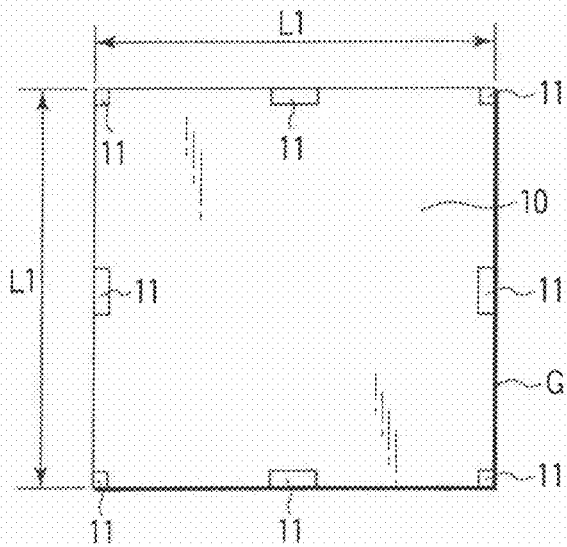
FIG. 8A is a schematic plan view of a quadrangular substrate.
Figure 8B:
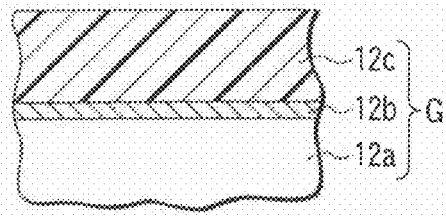
FIG. 8B is a partial sectional view of a quadrangular substrate.
Figure 8C:
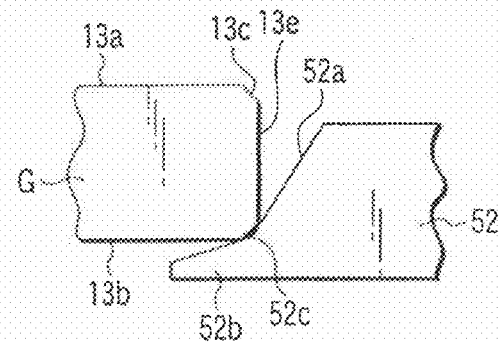
FIG. 8C is an enlarged side view showing a part of a quadrangular substrate supported by a transfer arm.
Figure 8D:
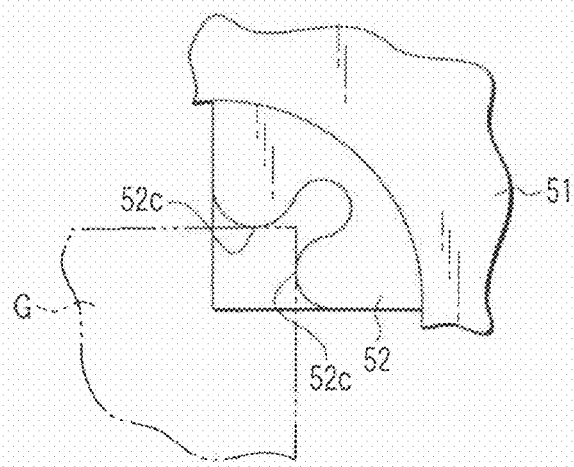
FIG. 8D is an enlarged plan view showing a part of a quadrangular substrate supported by a transfer arm.

As shown in FIG. 8B, the mask substrate G has a chromium oxide ($Cr_2O_3$) coating film 12b on a transparent substrate 12a of quartz glass, and a resist coating film 12c is formed on the coating film. The chromium oxide coating film 12b has an average thickness of 30 to 60 nm and the resist coating film 12c has an average thickness of 400 to 500 nm.

The mask substrate G has a side length L1 of 152±0.4 mm and a thickness of a quarter inch (6.35±0.1 mm). The projected length of the C-plane 13c is 0.2 to 0.6 mm.

The case where a mask substrate G is transferred from the transfer arm mechanism 5 to the spin chuck 2 will be briefly explained. First, the transfer arm mechanism 5 holding the substrate G is moved above the spin chuck 23. Then, the arm member 51 is moved down while passing the support pieces 52 through the airflow port 25. In this manner, the region (substrate) surrounded by the arm member 51 is moved relative to the spin chuck 2, thereby mounting the substrate G on the holding plate 23. When the substrate G is unloaded from the spin chuck 2, the aforementioned operation is reversely performed.

Next, a method of forming a coating film on the surface of the substrate G by using the coating and processing apparatus mentioned above will be explained.

First, the spin chuck 2 is moved up to above the outer cup 3 in the state where the ring plate 38 is set at the predetermined uppermost position and a substrate G is transferred to the spin chuck 2 from a transfer arm mechanism 5. Then, the spin chuck 2 moves down while holding the substrate G and further the ring plate 38 moves down to the predetermined lowermost position. Subsequently, the coating solution nozzle 39 is guided to a position facing the center of the substrate G. Thereafter, a coating solution, a resist solution, is discharged toward the center portion of the substrate G from the coating solution nozzle 39 and the substrate G is subsequently rotated at a high speed together with the spin chuck 2 synchronously for 2 to 3 seconds at a first rotation speed, for example, 2,500 rpm. The resist solution supplied to the substrate G spreads toward the peripheral edge of the substrate G by centrifugal force given by rotation of the substrate G and finally an excessive resist solution is shaken off from the substrate. Subsequently, while the coating solution nozzle 39 is moved back, the substrate G is rotated together with the spin chuck 2 at a second rotation speed as low as, e.g., 1000 rpm, for 15 to 30 seconds, thereby accelerating evaporation of a solvent (thinner) contained in a resist solution on the surface of the substrate G. As a result, a resist film having a thickness of about 0.6 μm is formed of the remaining resist components on the surface of the substrate G. Incidentally, a resist solution may be supplied from the coating solution nozzle 39 while the spin chuck 2 is rotated.

Next, a step of rinsing the back surface of the substrate G (referred to as a "back rinse step") will be explained with reference to FIGS. 9A to 9D, 10 and 11.

Figure 9A:
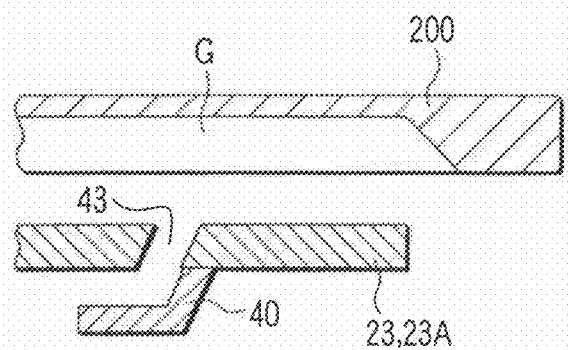
FIGS. 9A to 9D are sectional views showing the steps of cleaning the back surface of a substrate by a coating and processing method according to an embodiment of the present invention.
Figure 9B:
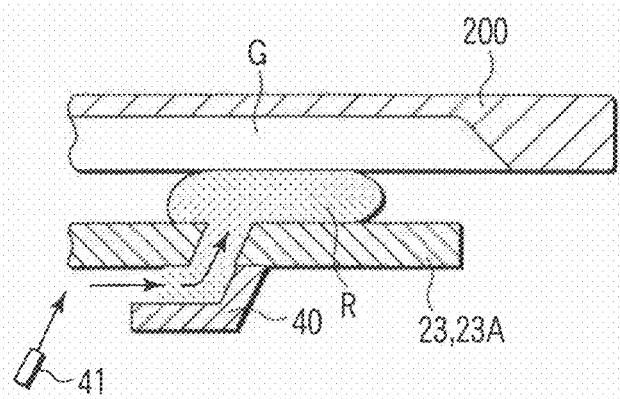
Figure 9C:
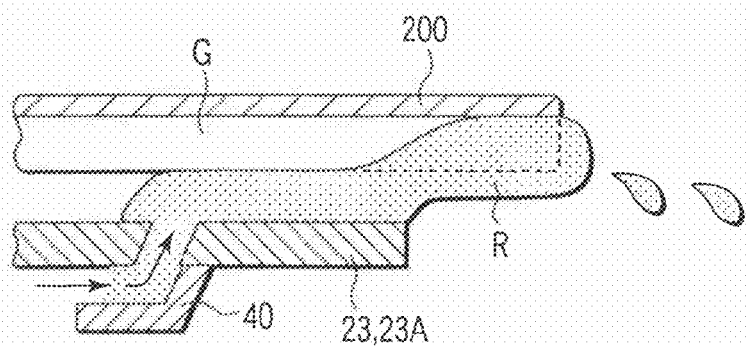

To the side surface and back surface of the substrate coated with the resist solution, resist components 200 are deposited as shown by hatched lines in FIG. 9A. To clean the resist components, a rinse liquid R is discharged from the rinse liquid discharge nozzles 41 while the substrate G is rotated at, for example, 500 rpm. More specifically, the rinse liquid R is sprayed from the nozzles arranged in a zigzag fashion such that the spray flows cross each other toward an inside position from the cover 40 attached to the back surface of the holding plate 23 at a flow rate of 60 ml/min. Since centrifugal force is working, the rinse liquid R is also guided along the back surface of the holding plate 23 and supplied to a clearance between the cover 40 and the holding plate 23. The rinse liquid R may be directly supplied to the clearance between the cover 40 and the holding plate 23.

The rinse liquid R is directed to a rinse liquid collecting portion 40a by centrifugal force (centripetal force), passed through the guide channel 43, introduced into a clearance between the substrate G and the holding plate 23, radially spread around the center of rotation by centrifugal action and diffused.

Figure 11:
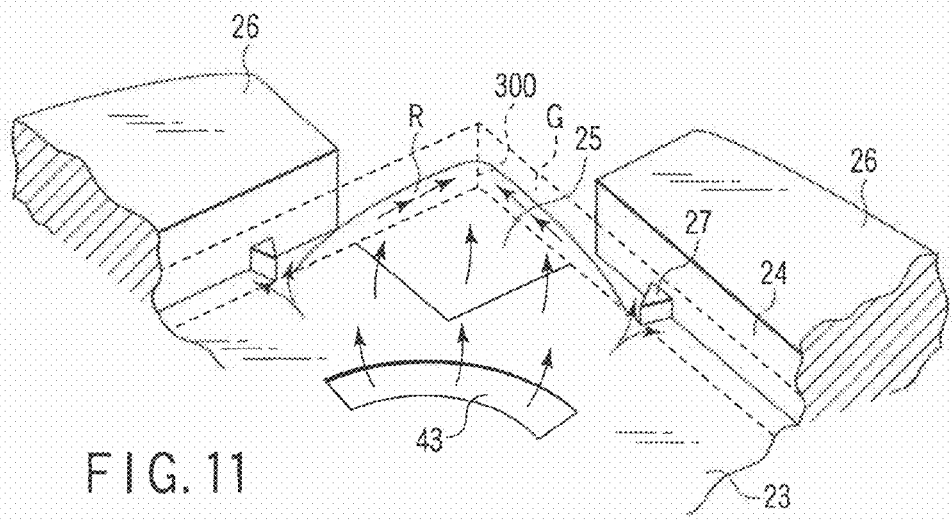
FIG. 11 is a schematic perspective view showing the state where the corner portions of the back surface of a substrate are cleaned with a rinse liquid.

As a result, as shown in FIG. 11, two flows of rinse liquid R are formed: one is directed toward the corner portion and the other is directed toward the wall 24. The latter flow strikes the surface of the wall 24 and changes direction. However, since the spacer 27 prevents the flow from spreading to the inside, the flow is finally directed toward the corner portion of the substrate G. As explained, the rinse liquid R supplied from each of the liquid supply ports 43 flows toward the corresponding corner portion of the back surface of the substrate G and is then diffused.

As shown in FIG. 9C, the rinse liquid R that has reached the periphery of the airflow port 25 further goes outward while attaching to the back surface side of the substrate G by the function of surface tension. The rinse liquid R that has expanded outward over the periphery of the corner portion of the substrate G flows while partly going to the side surface of the substrate. When the rinse liquid R that has reached the corner of the corner portion of the substrate G is shaken off, it goes to the side surface due to the surface tension. Consequently, a rising corner 300 can be cleaned.

Incidentally, the boundary between the back surface 13b and the side surface 13e of the substrate G and that between the surface 13a and the side surface 13e are rounded to form the C planes 13c, as shown in FIG. 8C. The rinse liquid R flows along the back surface 13b and then along the C plane 13c and goes to the side surface 13e to clean the surface 13e.

Figure 9D:
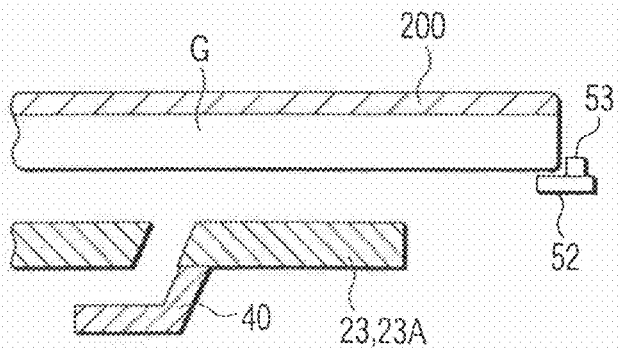

After 5 to 30 seconds from initiation of supply of the rinse liquid R, the supply of the rinse liquid R is stopped and the spin chick is rotated for several seconds to shake off the rinse liquid R. After completion of cleaning, the ring plate 38 is moved up and then the spin chuck 2 is lifted, and the transfer arm mechanism 5 receives the substrate by the substrate support pieces 52 and unloads it, as shown in FIG. 9D.

Figure 10:
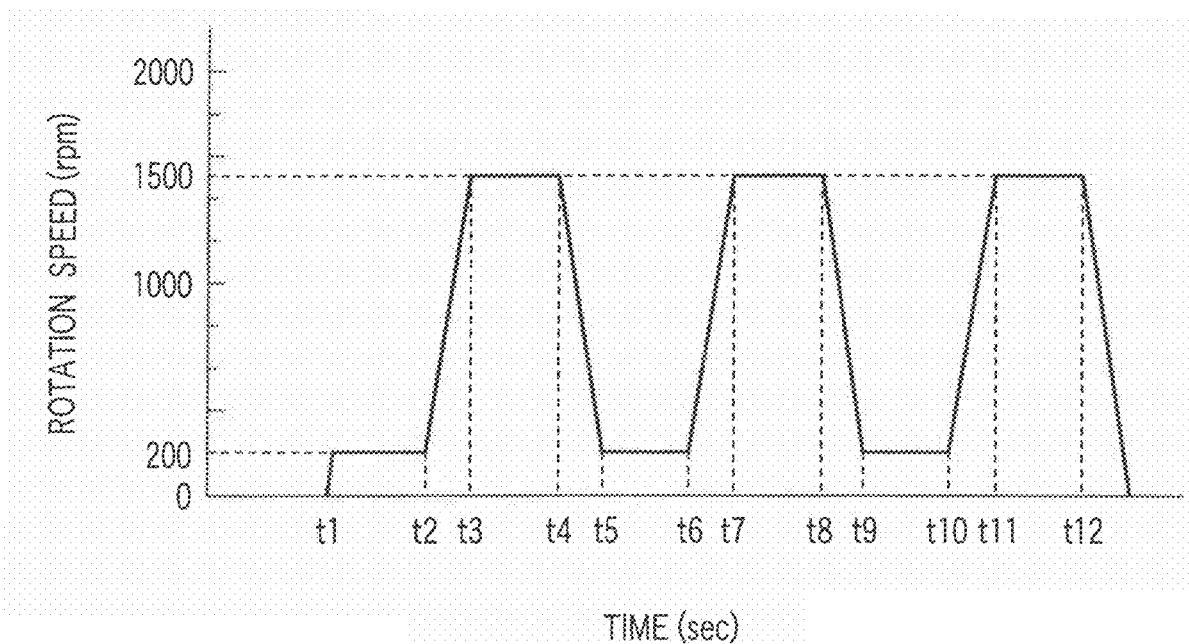
FIG. 10 is a timing chart of a back surface cleaning step of a coating and processing method according to an embodiment of the present invention.

An embodiment of the back rinse step will be explained with reference to FIG. 10.

After transfer of a mask substrate G to the spin chuck 2 is completed, rotation of the spin chuck 2 is first started at a low speed of 200 rpm at time-point 1 (t1). At time-point 2 (t2), the speed is increased to 1,500 rpm at an acceleration rate of 1,000 to 5,000 rpm/second and maintained at 1,500 rpm for 3 seconds (t3 to t4). During this period, a rinse liquid is sprayed to the holding plate 23 from the nozzles 41. At time point, t4, the rotation speed is reduced to 200 rpm at a deceleration rate of 1,000 to 5,000 rpm/second and maintained at 200 rpm for 3 seconds (t5 to t6). During this period, the rinse liquid is continuously sprayed from the nozzles 41. At time point t6, the rotation speed is increased to 1,500 rpm at an acceleration rate of 1000 to 5000 rpm/second and maintained at 1,500 rpm for 3 seconds (t7 to t8). During this period, the rinse liquid is continuously sprayed from the nozzles 41. At time point t8, the rotation speed is reduced to 200 rpm at a deceleration rate of 1000 to 5000 rpm/second and maintained at 200 rpm for 3 seconds (t9 to t10). During this period, the rinse liquid is continuously sprayed from the nozzles 41. At time point t10, the rotation speed is increased to 1,500 rpm at an acceleration rate of 1000 to 5000 rpm/second and maintained at 1,500 rpm for 3 seconds (t11 to t12). During this period, the rinse liquid is continuously sprayed from the nozzles 41. At time point t12, supply of the rinse liquid from the nozzles 41 is stopped and the rotation speed is decreased at a deceleration rate of 1000 to 5000 rpm/second. In this way, the rotation of the spin chuck 2 is terminated. The high-speed rotation and the low-speed rotation of the spin chuck are alternately repeated 3 times. In this manner, the resist deposit is successfully removed completely from the back surface 13b and the side surface 13e of the mask substrate G. Specifically, the resist deposit can be satisfactorily removed from the C-plane 13c of the mask substrate G by alternately changing the low-speed rotation and the high-speed rotation of the spin chuck 2.

When the rotation speed during the low-speed rotation operation is lower than 200 rpm (e.g., 100 rpm), resist goes from the upper surface to the lower surface. Since such a disadvantage is produced, the lowermost value of the rotation speed of the substrate is set at 200 rpm during the back rinse step. On the other hand, when the rotation speed during the high-speed rotation operation exceeds 1,500 rpm, the rinse liquid tends to be rejected by the holding plate 23. As a result, the rinse liquid is splashed back toward the nozzles 41 and scattered on the periphery of the spin chuck. For this reason, the upper value of the rotation speed of the substrate during the back rinse step is set at 1,500 rpm.

According to the embodiment mentioned above, a rinse liquid is supplied to a clearance between the substrate G and the holding plate 23, while the substrate G and the holding plate 23 are synchronously rotated. By virtue of this constitution, centrifugal force produced by rotation and the surface tension of the rinse liquid supplied on the substrate G cooperationally work to clean the back surface and side surface of the corner portion of the substrate G. Consequently, the resist solution attached at least to the side surface near the bottom and the back surface of the corner portion during resist-coating time can be removed. Therefore, even if the back surface of the corner portion is held by the transfer arm mechanism 5, the substrate support pieces 52 of the transfer arm mechanism 5 can be prevented from contamination. As a result, even if the substrates G are loaded into and unloaded from the apparatus one by one by the transfer arm mechanism 5, the corner portion of substrates G cannot be contaminated. Furthermore, when the substrate G is transferred without being held at four corners by the transfer arm mechanism 5, for example, in the case where another unit holds the substrate G at the four corners, so-called cross contamination can be prevented.

Furthermore, according to the embodiments mentioned above, the guide channel 43 is arranged at a position corresponding to each of the corner portions of the substrate G, specifically, at a position from which a rinse liquid is supplied, the rinse liquid can reach the corners of the substrate, for example, on the diagonal lines of the substrate G. With this arrangement, the rinse liquid can be aggressively (positively) supplied toward a target to be cleaned, that is, the corner portions of the substrate G. Furthermore, since the rinse liquid collecting portion 40a is provided, the rinse liquid can be collected in the guide channel 43 by the help of centrifugal force (centripetal force) compared to the case where the rinse liquid is supplied from the center of the substrate G, and the amount of the rinse liquid can be reduced. As a result, the present invention can advantageously decrease the cost.

Furthermore, by providing the wall 24 along the periphery of the substrate G, a rinse liquid is supplied toward the corner portions as a matter of course without caring. In addition, since a guide channel 43 is formed so as to span the lines connecting the center of the substrate G and a pair of spacers 27, the spacers 27 can be cleaned. In addition, since the rinse liquid strikes the wall 24 and flows in the clearance between the substrate G and the wall 24, it is regulated by the spacers 27 so as not to expand inward. As a result, the rinse liquid can be supplied toward the corner portions without fail.

According to the embodiment, the cut-away portions 25 are formed in the spin chuck 2 and the substrate G is transferred to and from the transfer arm mechanism by holding the corner portions of the substrate G exposed in the cut-away portions 25.

Therefore, load and unload of the substrate G can be easily performed.

Figure 12A:
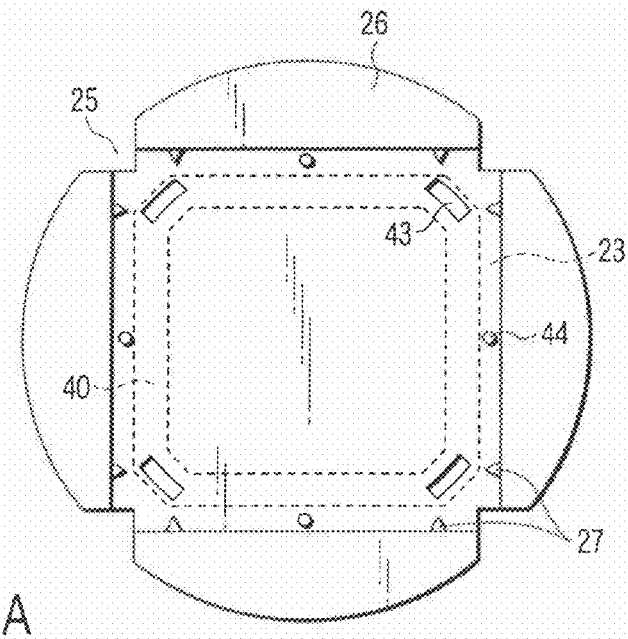
FIG. 12A is a plan view showing a spin chuck according to another embodiment.
Figure 12B:
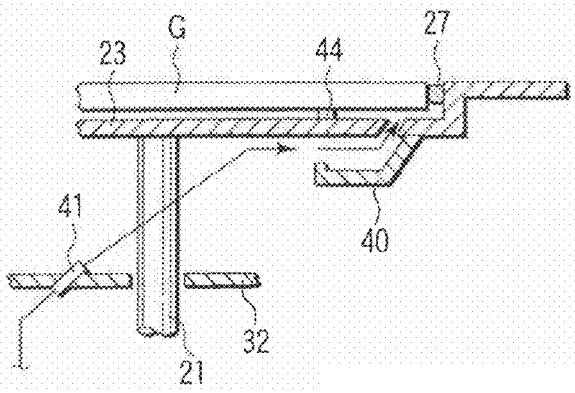
FIG. 12B is a partial plan view showing a spin chuck according to another embodiment.

The cover 40 of the present invention is not limited to the structure having a rinse liquid collection portion 40a (it may partly extend). For example, as shown in FIGS. 12A and 12B, the cover 40 may be in the form of a trough like a ring covering and including the guide channels 43. Even if the cover has a ring-form, the rinse liquid discharged from the rinse liquid discharge nozzles 41 toward the back surface of the holding plate 23 flows along the back surface of the holding plate 23 by centrifugal force, and reaches the trough, splashes out of the guide channel 43 and is supplied to the substrate G. Therefore, the same effects can be obtained as mentioned above.

Figure 13:
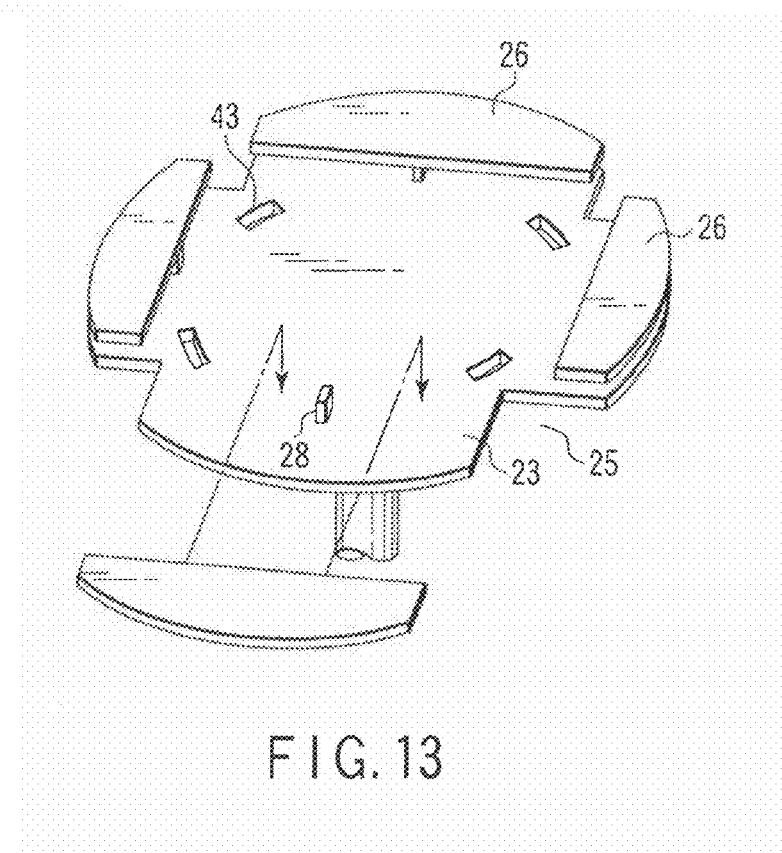
FIG. 13 is a perspective view of a spin chuck according to another embodiment, partially broken away.

Furthermore, the structure of the spin chuck of the present invention is not limited to that having the walls 24 on the spin chuck 2. The structure of the spin chuck shown in FIG. 13 may be used. More specifically, the spin chuck has the guide channels 43, cut-away portions 25, the holding plate 23 for placing a substrate G thereon at the center, and spacers 28 provided in the periphery of the substrate holding region and air-flow controlling members 26. The outer edge of the air-flow-controlling member 26 exhibits the same shape as that of the holding plate 23. Each of the airflow controlling members 26 is supported by the spacer at the inner periphery. Also in this case, the rinse liquid supplied from the guide channel 43 into a clearance between the substrate G and the holding plate 23 is directed toward the corner portions of the substrate due to centrifugal force generated by the synchronous rotation of the substrate G and the holding plate 23. Therefore, the corner potions can be cleaned. Thus, the same effects as mentioned above can be obtained.

Figure 14:
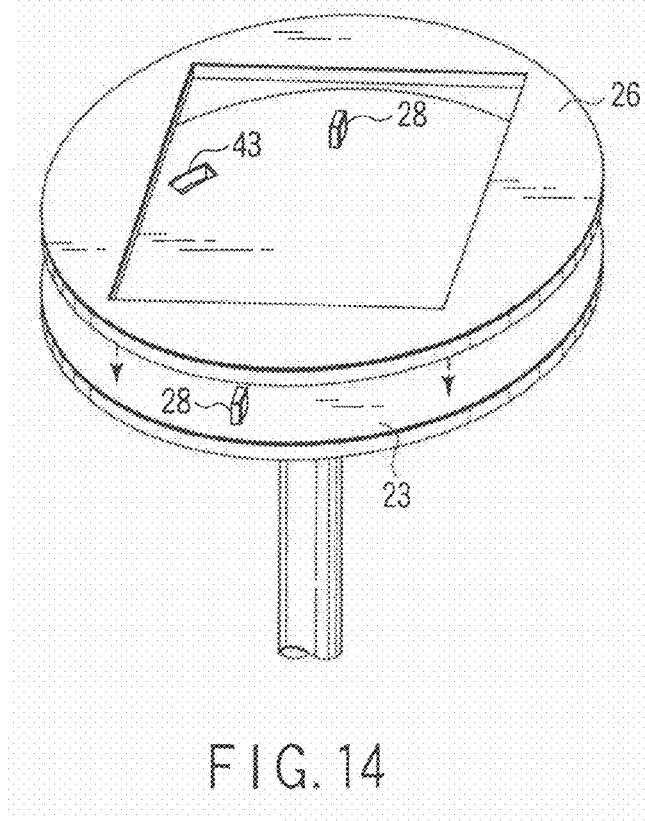
FIG. 14 is a perspective view showing a spin chuck according to another embodiment.

Furthermore, in the present invention, the structure of the spin chuck 2 is not limited to that having the cut-away portions 25. The structure shown in FIG. 14 may be used. More specifically, there is a spin chuck having a guide channel 43, a circular holding plate 23 having a substrate holding region at the center an airflow controlling member 26 having an opening region corresponding to the substrate holding region, and a spacer 28 supporting the member 26. Also in this case, a rinse liquid can go to the side surface of the substrate G due to the surface tension. Therefore, the same effects as mentioned above can be obtained. However, in this case, the corner portions of the substrate G are not exposed to the outside from the holding plate 23. In order for the transfer arm mechanism 5 to hold the substrate G, for example, through-holes are formed in the surface of the holding plate 23 and a substrate lift-up member passing though each of the through-holes is provided. The substrate G is lifted up by the substrate lift-up members moved through the holes and transferred to the transfer arm mechanism 5.

Figure 15:
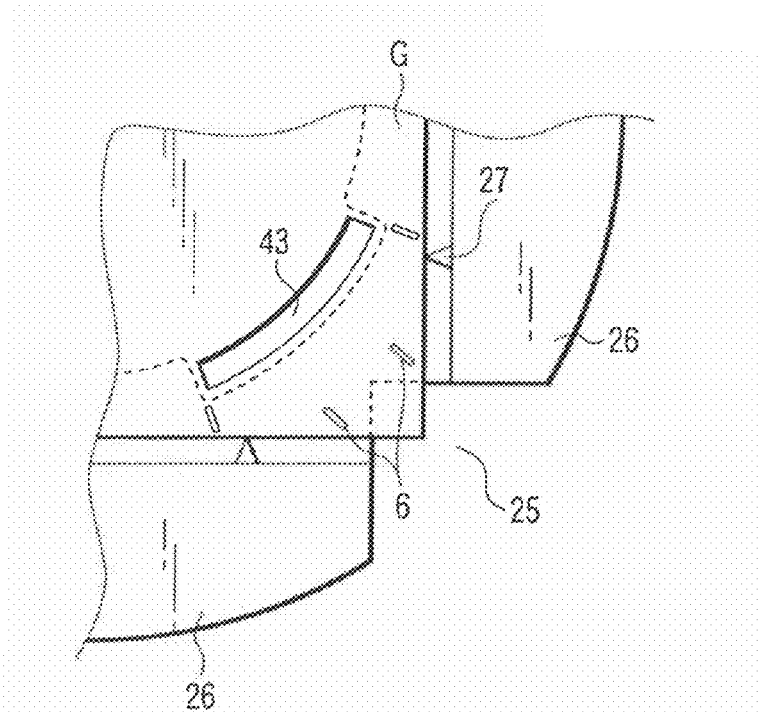
FIG. 15 is an enlarged plan view showing a part of a rinse liquid supply unit according to another embodiment.

In the present invention, as shown in FIG. 15, liquid flow guide members 6 may be provided on the surface of the holding plate 23 in order to control the direction of flow of the rinse liquid. Even with this structure, the same effects as above can be obtained.

The arrangement of the liquid-flow guide members 6 may be desirably determined depending upon the purpose, more specifically, whether a rinse liquid is directed toward the corner portions or not without fail or a rinse liquid is directed so as to clean the spacer 27 without fail.

Figure 16:
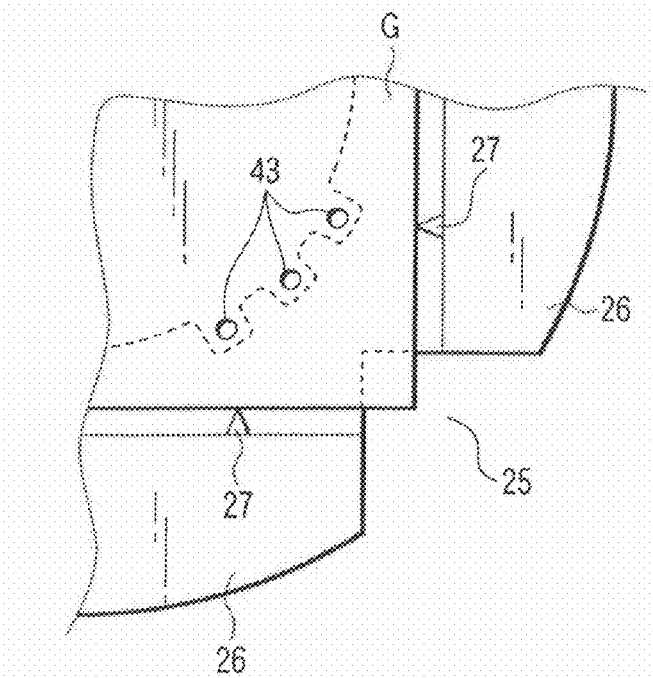
FIG. 16 is an enlarged plan view showing a part of a rinse liquid supply unit according to another embodiment.
Figure 17:
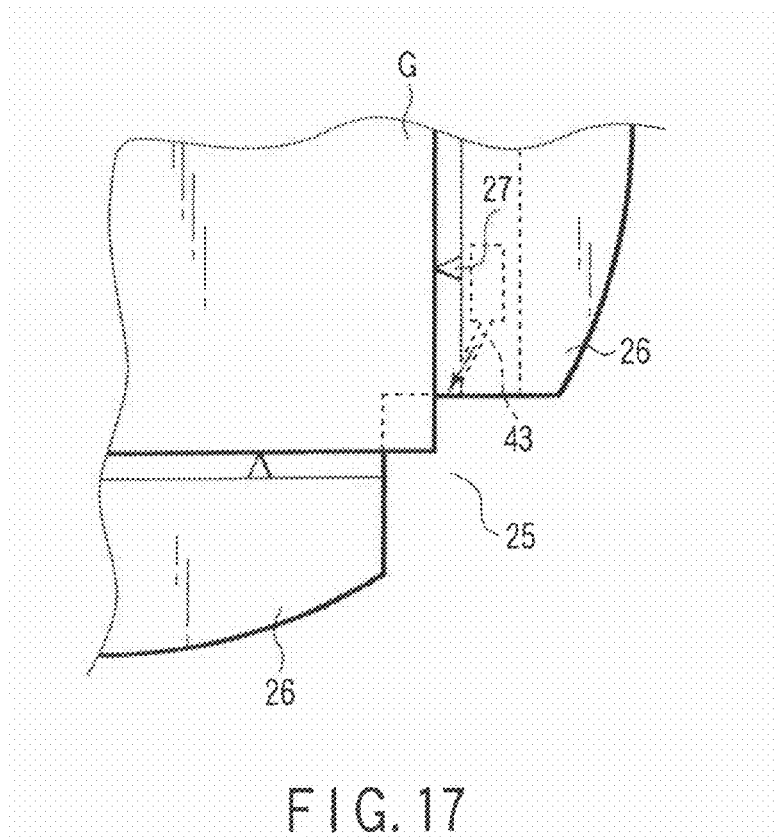
FIG. 17 is an enlarged plan view showing a part of a rinse liquid supply unit according to another embodiment.

Furthermore, in the present invention, the shape of the guide channel 43 is not limited to a fan. Circular-form guide channel may be arranged side by side, as shown in FIG. 16. How to arrange the guide channels 43 is desirably determined by performing a preliminary test.

In the present invention, the guide channels 43 need not necessary formed in the surface of the holding plate 23 and may be formed in the inner side surface of the wall 24. Also in this case, the same effects as mentioned above can be obtained by supplying a rinse liquid to a clearance between the substrate G and the holding plate 23. Furthermore, a guide channel 43 may be provided so as to directly supply a rinse liquid to the side surface of each of the corner portions of the substrate G.

Figure 18:
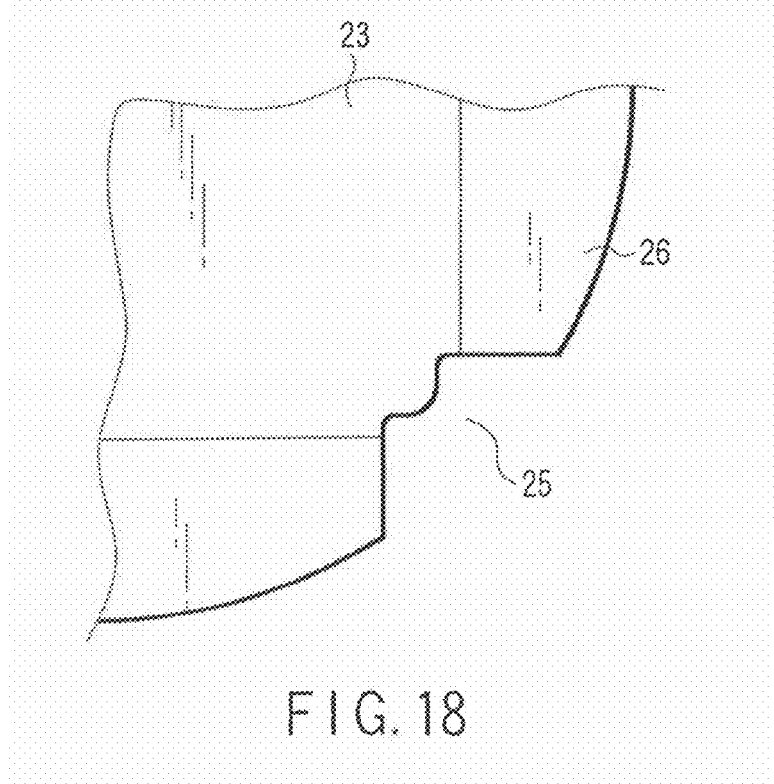
FIG. 18 is an enlarged plane view showing a part of a spin chuck according to another embodiment.

In the present invention, the cut-away potions 25 need not be always formed in a rectangular shape and may be formed in an arch form. To supply a rinse liquid to the corners of the substrate G without fail, the substrate holding portion may extend into the cut-away portion, as shown in FIG. 18 and further may be slightly inclined upward even with the structure, the same effects as mentioned above can be obtained.

Furthermore, in the present invention, the substrate G is not limited to a mask substrate and may be a glass substrate for a liquid crystal display and also a semiconductor wafer. In the present invention, the coating process is not limited to a process for coating a resist solution and may be a developing process performed by supplying a developer to a substrate after light exposure or a cleaning process performed by supplying a rinse liquid to a substrate.

Figure 19:
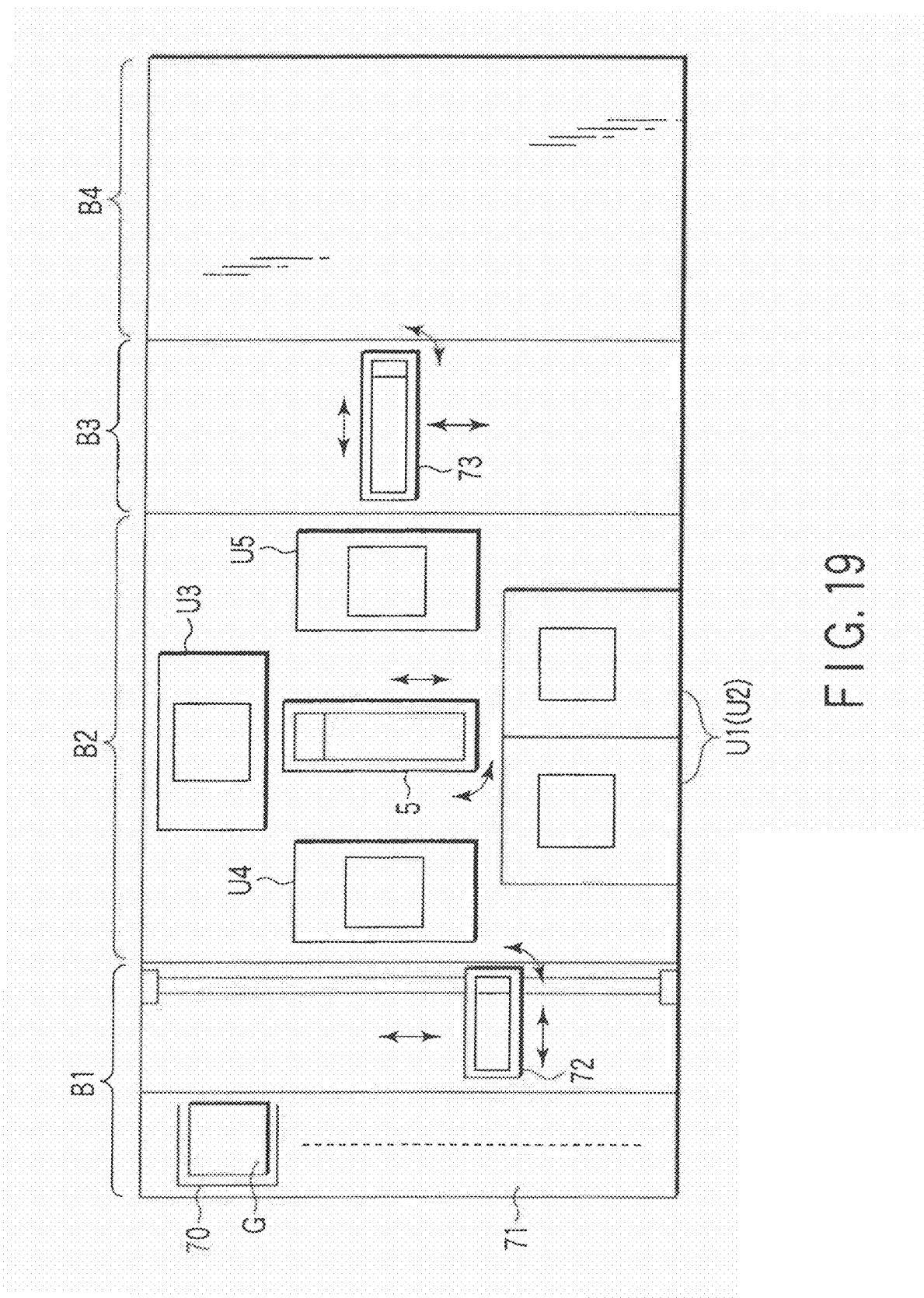
FIG. 19 is a schematic plan view showing the entire coating and developing apparatus.
Figure 20:
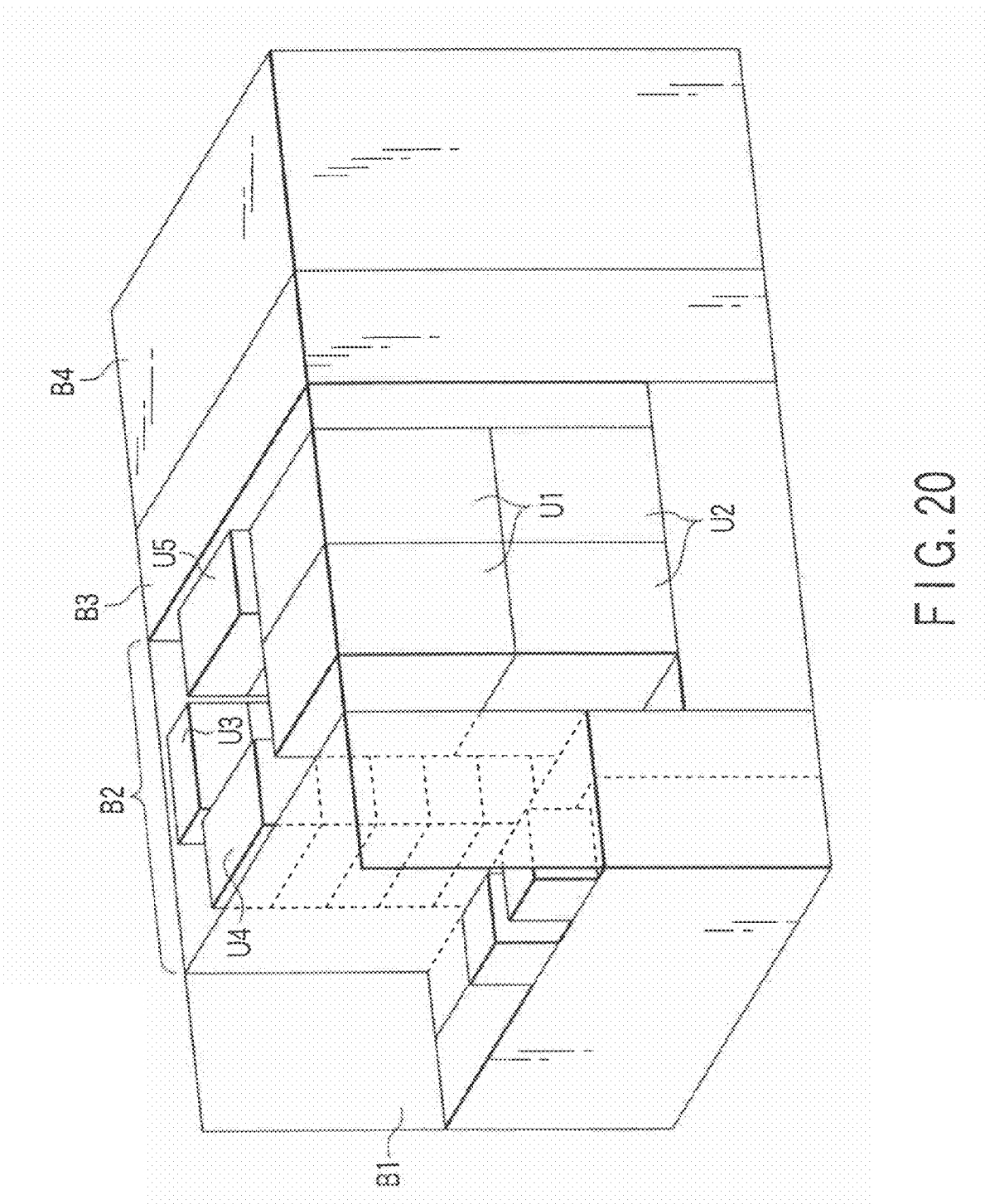
FIG. 20 is a schematic perspective view showing the entire coating and developing apparatus.

Finally, a coating and developing apparatus having a coating and processing apparatus of the present invention as a coating unit U1 will be explained with reference of FIGS. 19 and 20.

In the figure, a carrier block B1 has a carrier-mounting section 71 for mounting a carrier 70, which stores a plurality of substrates G, and a transfer means 72. At the back of the carrier block B1, a process block B2 is connected thereto. In the process block B2, the transfer arm mechanism 5 mentioned above is provided as a main transfer mean. So as to surround the transfer arm mechanism 5, the coating unit U1 and a developing unit U2 for developing a substrate G after light exposure are arranged at the right hand side, and a cleaning unit U3 for cleaning a substrate G at the left hand side as viewed from the carrier block B1. Furthermore, shelves U4 and U5, in which heating/cooling units for heating and cooling a substrate and transferring units for transferring a substrate are stacked in multiple stages, are arranged in the front and the back sides respectively. Furthermore, the transfer arm mechanism 5 is configured so as to move up and down, back and forth, and rotate around the vertical shaft, thereby enabling transfer of a substrate G to and from the coating unit U1, developing unit U2, cleaning unit U3 and stack units U4 and U5. Moreover, the process block B2 is connected to a light-exposure block B4 via an interface block B3. In the light-exposure block B3, a substrate G coated with a resist film is exposed to light by using a predetermined mask. In the interface block B3, a transfer means 73 is provided which is configured so as to transfer a substrate G between a transfer unit, one of the units stacked in the stack unit U5, and the light-exposure block B4.

The flow of a substrate G will now be briefly explained. When the carrier 70 storing substrates G is loaded into the carrier mounting section 71 from the outside, a substrate G is taken out from a cassette C by the transfer means 72 and transferred to the transfer arm mechanism 5 via a transfer unit stored in the stack unit U4 and then loaded into the cleaning unit U3, heating unit, cooling unit and coating unit U1, sequentially in this order. In this manner, for example, a resist film is formed. Subsequently, the substrate is prebaked in the heating unit and cooled to a predetermined temperature in the cooling unit and, thereafter, loaded into the light-exposure block B4 by the transfer means 73 and then exposed to light. After that, the substrate G is loaded into the heating unit, in which post exposure baking is performed at a predetermined temperature. The resultant substrate is cooled to a predetermined temperature in the cooling unit and then developed in the developing unit U2. The substrate G to which predetermined treatments have been applied and on which, for example, a resist pattern is formed is returned to the carrier 70.

According to the present invention, a substrate and a rinse liquid supply unit are synchronously rotated to supply a rinse liquid to the back surface of the substrate, thereby cleaning the side surfaces of the corner portions and the back surface of the substrate. Hence, the substrate can be transferred while holding the four corners thereof.

The invention claimed is:

1. A method of spin coating a coating solution on a quadrangular mask substrate used in exposure processing of a photolithographic process and removing a coating solution undesirably attached to a back surface and a side surface of the substrate by a rinse liquid, comprising the steps of:

(p1) preparing a spin chuck comprising a cover having a rinse liquid collection portion, a coating solution nozzle, a rinse liquid nozzle, a pair of spacers mounted on the spin chuck, a holding plate having a top surface being provided with liquid flow guide members that control a direction of flow of the rinse liquid toward the corner portions, and a guide channel opening at a position corresponding to each of corner portions of the substrate on the holding plate and communicating with the rinse liquid collection portion;

(a) supporting the back surface of the substrate by substrate supporting members while slightly separating upward from the surface of the holding plate, and positioning the substrate to the spin chuck by the pair of spacers thereby holding the substrate horizontally with the holding plate provided on the spin chuck by a periphery of the substrate, with a clearance between the substrate and the holding plate;

(b) supplying the coating solution from the coating solution nozzle to a surface of the substrate held by the spin chuck and spreading the coating solution with the help of centrifugal force by rotating the spin chuck around a vertical axis; and (c) supplying the rinse liquid to the clearance to reach the back surface of the substrate from the rinse liquid nozzle while rotating the holding plate synchronously with a substrate around the vertical axis, and supplying the rinse liquid through the rinse liquid collection portion and the guide channel serving as a rinse liquid supply port formed at a position of the holding plate corresponding to each of the corner portions of the substrate, thereby permitting the rinse liquid to reach the corner portions of the substrate with the help of centrifugal force to wash away the coating solution.

2. The method according to claim 1, wherein the guide channels are through-holes radially arranged on a concentric circle around a rotation center of the holding plate.

3. The method according to claim 1, wherein the guide channels are through-holes obliquely passing outward from a lower surface of the holding plate to an upper surface of the holding plate for smoothly directing the rinse liquid sprayed on the lower surface of the holding plate by the nozzles toward the back surface of the substrate.

4. The method according to claim 1, wherein, in the step (c), the substrate is rotated by the spin chuck alternately at a predetermined low rotation speed and high rotation speed with a range of 200 to 1,500 rpm.

5. The method according to claim 4, wherein, in the step (c), an acceleration rate for changing the low rotation speed to the high rotation speed and a deceleration rate for changing the high rotation speed to the low rotation speed fall within the range of 1,000 to 5,000 rpm/second.

6. The method according to claim 1, wherein the guide channels are an arch-shape.

7. A method of spin coating a coating solution on a quadrangular mask substrate used in exposure processing of a photolithographic process and removing a coating solution undesirably attached to a back surface and a side surface of the substrate by a rinse liquid, comprising the steps of:

(p1) preparing a spin chuck comprising a holding plate, a cover having a rinse liquid collection portion, a coating solution nozzle, a rinse liquid nozzle, a pair of spacers mounted on the spin chuck, air flow controlling members being supported by air flow controlling member spacers, an outer edge of the air flow controlling members being the same shape as the holding plate, and a guide channel opening at a position corresponding to each of corner portions of the substrate on the holding plate and communicating with the rinse liquid collection portion;

(a) supporting the back surface of the substrate by substrate supporting members while slightly separating upward from the surface of the holding plate, and positioning the substrate to the spin chuck by the pair of spacers thereby holding the substrate horizontally with the holding plate provided on the spin chuck by a periphery of the substrate, with a clearance between the substrate and the holding plate;

(b) supplying the coating solution from the coating solution nozzle to a surface of the substrate held by the spin chuck and spreading the coating solution with the help of centrifugal force by rotating the spin chuck around a vertical axis; and (c) supplying the rinse liquid to the clearance to reach the back surface of the substrate from the rinse liquid nozzle while rotating the holding plate synchronously with a substrate around the vertical axis, and supplying the rinse liquid through the rinse liquid collection portion and the guide channel serving as a rinse liquid supply port formed at a position of the holding plate corresponding to each of the corner portions of the substrate, thereby permitting the rinse liquid to reach the corner portions of the substrate with the help of centrifugal force to wash away the coating solution.

8. The method according to claim 7, wherein the guide channels are through-holes radially arranged on a concentric circle around a rotation center of the holding plate.

9. The method according to claim 7, wherein the guide channels are through-holes obliquely passing outward from a lower surface of the holding plate to an upper surface of the holding plate for smoothly directing the rinse liquid sprayed on the lower surface of the holding plate by the nozzles toward the back surface of the substrate.

10. The method according to claim 7, wherein, in the step (c), the substrate is rotated by the spin chuck alternately at a predetermined low rotation speed and high rotation speed with a range of 200 to 1,500 rpm.

11. The method according to claim 10, wherein, in the step (c), an acceleration rate for changing the low rotation speed to the high rotation speed and a deceleration rate for changing the high rotation speed to the low rotation speed fall within the range of 1,000 to 5,000 rpm/second.

12. The method according to claim 7, wherein the guide channels are an arch-shape.

* * * * *